United States Patent
Nagata et al.

(10) Patent No.: US 9,570,656 B2
(45) Date of Patent: Feb. 14, 2017

(54) GROUP III NITRIDE SEMICONDUCTOR LIGHT-EMITTING DEVICE

(71) Applicant: Toyoda Gosei Co., Ltd., Kiyosu-shi (JP)

(72) Inventors: Kengo Nagata, Kiyosu (JP); Ryo Nakamura, Kiyosu (JP)

(73) Assignee: TOYODA GOSEI CO., LTD., Kiyosa-Shi, Aichi-Ken (JP)

( * ) Notice: Subject to any disclaimer, the term of this patent is extended or adjusted under 35 U.S.C. 154(b) by 214 days.

(21) Appl. No.: 14/485,522

(22) Filed: Sep. 12, 2014

(65) Prior Publication Data
US 2015/0083993 A1   Mar. 26, 2015

(30) Foreign Application Priority Data

Sep. 25, 2013 (JP) ................................ 2013-198723

(51) Int. Cl.
   *H01L 29/06* (2006.01)
   *H01L 33/32* (2010.01)
   *H01L 33/06* (2010.01)
   *H01L 33/24* (2010.01)

(52) U.S. Cl.
   CPC ............... *H01L 33/32* (2013.01); *H01L 33/06* (2013.01); *H01L 33/24* (2013.01)

(58) Field of Classification Search
   CPC ........... H01L 33/06; H01L 33/32; H01L 33/24
   USPC ......................................................... 257/13
   See application file for complete search history.

(56) References Cited

U.S. PATENT DOCUMENTS

| | | |
|---|---|---|
| 8,507,891 B2 | 8/2013 | Nakamura |
| 8,698,123 B2 | 4/2014 | Shioda et al. |
| 8,872,158 B2 | 10/2014 | Shioda et al. |
| 8,937,325 B2 | 1/2015 | Kushibe et al. |
| 9,252,325 B2 | 2/2016 | Mukono et al. |
| 2011/0309327 A1* | 12/2011 | Jeong ...................... H01L 33/32 257/13 |

(Continued)

FOREIGN PATENT DOCUMENTS

| | | | | |
|---|---|---|---|---|
| JP | 2002-064249 A | * | 2/2002 | ........... H01L 21/205 |
| JP | 2007-180495 A | | 7/2007 | |

(Continued)

OTHER PUBLICATIONS

Japanese Office Action dated Jan. 6, 2016 in Japanese Patent Application No. 2012-265566 with a partial English translation thereof.

(Continued)

*Primary Examiner* — Vongsavanh Sengdara
(74) *Attorney, Agent, or Firm* — McGinn IP Law Group, PLLC.

(57) ABSTRACT

The present invention provides a Group III nitride semiconductor light-emitting device having a flat semiconductor layer, in which the stress applied to the light-emitting layer is relaxed. The light-emitting layer of the light-emitting device includes a well layer and a barrier layer comprising an AlGaN layer containing In. The light-emitting device has a pit extending from an n-type semiconductor layer to layers above the light-emitting layer. A pit diameter at an interface between the light-emitting layer and the n-type semiconductor layer is 120 nm to 200 nm. The barrier layer has an In concentration of $6.0 \times 10^{19}$ $cm^{-3}$.

16 Claims, 6 Drawing Sheets

(56) References Cited

U.S. PATENT DOCUMENTS

| | | | |
|---|---|---|---|
| 2012/0205618 A1* | 8/2012 | Nakamura | H01L 33/24 257/13 |
| 2012/0217471 A1 | 8/2012 | Shioda et al. | |
| 2012/0248074 A1 | 10/2012 | Hussary et al. | |
| 2013/0069033 A1 | 3/2013 | Kushibe et al. | |
| 2013/0256650 A1 | 10/2013 | Yang et al. | |
| 2014/0084241 A1 | 3/2014 | Okuno et al. | |
| 2014/0154828 A1* | 6/2014 | Mukono | H01L 33/007 438/46 |
| 2014/0166978 A1 | 6/2014 | Shioda et al. | |

FOREIGN PATENT DOCUMENTS

| | | |
|---|---|---|
| JP | 2008-218746 A | 9/2008 |
| JP | 2011-049452 A | 3/2011 |
| JP | 2012-169383 A | 9/2012 |
| JP | 2012-178386 A | 9/2012 |
| JP | 2013-065632 A | 4/2013 |
| WO | WO 2006/023060 A2 | 3/2006 |
| WO | WO 2011/022128 A2 | 2/2011 |

OTHER PUBLICATIONS

Japanese Office Action dated Jan. 26, 2016 in Japanese Patent Application No. 2013-198723 with a partial English translation thereof.

* cited by examiner

GROUP III NITRIDE SEMICONDUCTOR LIGHT-EMITTING DEVICE

BACKGROUND OF THE INVENTION

Field of the Invention

The present invention relates to a Group III nitride semiconductor light-emitting device in which the stress applied to a light-emitting layer is relaxed.

Background Art

A Group III nitride semiconductor light-emitting device includes a light-emitting layer which emits light through recombination of electrons and holes. The light-emitting layer includes a well layer and a barrier layer. The barrier layer has a larger bandgap than that of the well layer. Some of the semiconductor light-emitting devices have a multi-quantum well structure (MQW structure) in which well layers and barrier layers are repeatedly deposited. An AlGaN layer may be used as a barrier layer. However, the crystal quality of the AlGaN layer is not so high. The degradation of crystal quality causes the reduction of light output efficiency.

Therefore, various techniques for improving the crystal quality have been developed. For example, Japanese Patent Application Laid-Open (kokai) No. 2002-64249 describes that a semiconductor layer having excellent crystal quality and less lattice defects is obtained by adding In to the AlGaN layer as a barrier layer and doping donor impurities to the AlGaN layer (refer to paragraph [0020]). In that case, the In concentration preferably falls within a range of $1 \times 10^{17}$ cm$^{-3}$ to $7 \times 10^{22}$ cm$^{-3}$ (refer to paragraph [0009]).

A flatter semiconductor layer is obtained by adding In to the AlGaN layer as a barrier layer. The studies of the present inventors and other researchers have gradually revealed that the pit induced by a threading dislocation can reduce the stress applied to the light-emitting layer. As a result of intensive studies of the present inventors, it was found that when In is added to the AlGaN layer while forming this pit, the AlGaN layer containing In fills the pit. Therefore, the effect of relaxing the stress applied to the light-emitting layer by the pit decreases, and thus, the light output efficiency of the semiconductor light-emitting device is reduced.

SUMMARY OF THE INVENTION

In view of the foregoing, the present invention was made to solve the conventional technical problems. An object of the present invention is to provide a Group III nitride semiconductor light-emitting device having a flat semiconductor layer, in which the stress applied to a light-emitting layer is relaxed.

In a first aspect of the present invention, there is provided a Group III nitride semiconductor light-emitting device comprising an n-type semiconductor layer, a light-emitting layer, and a p-type semiconductor layer. The light-emitting layer comprises a well layer and a barrier layer comprising an AlGaN layer containing In. The barrier layer has an In concentration not larger than $6 \times 10^{19}$ cm$^{-3}$. Moreover, the Group III nitride semiconductor light-emitting device has a pit generated so as to extend from the n-type semiconductor layer to at least an interface between the light-emitting layer and the p-type semiconductor layer. The pit diameter falls within a range of 120 nm to 200 nm at an interface between the light-emitting layer and the n-type semiconductor layer.

In the Group III nitride semiconductor light-emitting device, the In concentration of the AlGaN layer is not so high in the light-emitting layer. Therefore, the pit is not completely filled with the AlGaN layer containing In. That is, the pit layer generated in the film thickness of the underlayer continuously extends over the top of the light-emitting layer. Therefore, the stress applied to the light-emitting layer can be relaxed. The top surface of the light-emitting layer is flat.

A second aspect of the present invention is drawn to a specific embodiment of the Group III nitride semiconductor light-emitting device according to the first aspect of the invention, wherein the barrier layer has an In concentration of $1.0 \times 10^{16}$ cm$^{-3}$ to $4.5 \times 10^{19}$ cm$^{-3}$.

A third aspect of the present invention is drawn to a specific embodiment of the Group III nitride semiconductor light-emitting device according to the first or second aspect of the invention, wherein the ratio of the pit diameter at an interface between the light-emitting layer and the p-type semiconductor layer to that at an interface between the light-emitting layer and the n-type semiconductor layer is 1.1 to 1.25.

The present invention provides a Group III nitride semiconductor light-emitting device having a flat semiconductor layer, in which the stress applied to the light-emitting layer is relaxed.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENT

Specific embodiment of the present invention will next be described with reference to the drawings by taking, as an example, the case where a semiconductor light-emitting device is produced. However, the present invention is not limited to the embodiment. Needless to say, the structures of the layers and electrodes forming the below-mentioned light-emitting devices are merely examples, and may differ from those exemplified in the below-described embodiment. The thickness of each layer, which is schematically shown in the drawings, does not correspond to its actual value. In the drawings, thickness of each layer is not an actually measured one but a conceptual thickness. Also, the dimensions of the pits shown in the drawings are larger than the actual values.

1. Semiconductor Light-Emitting Device

Figure 1:
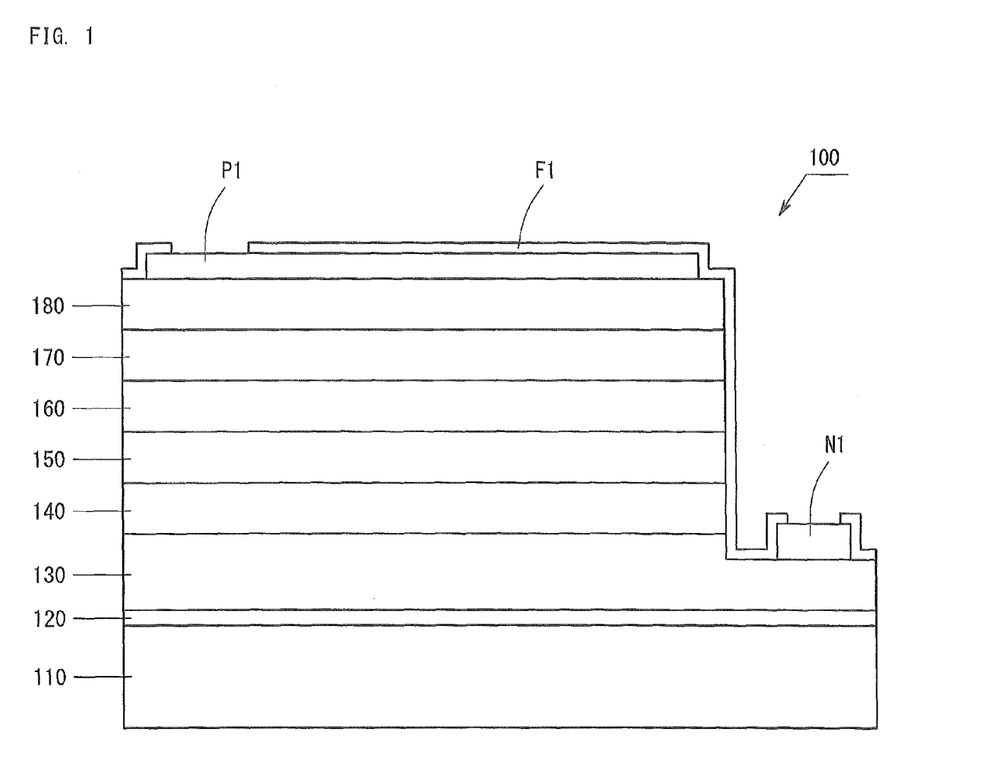
FIG. 1 is a schematic view of the structure of a Group III nitride semiconductor light-emitting device according to embodiment.
Figure 2:
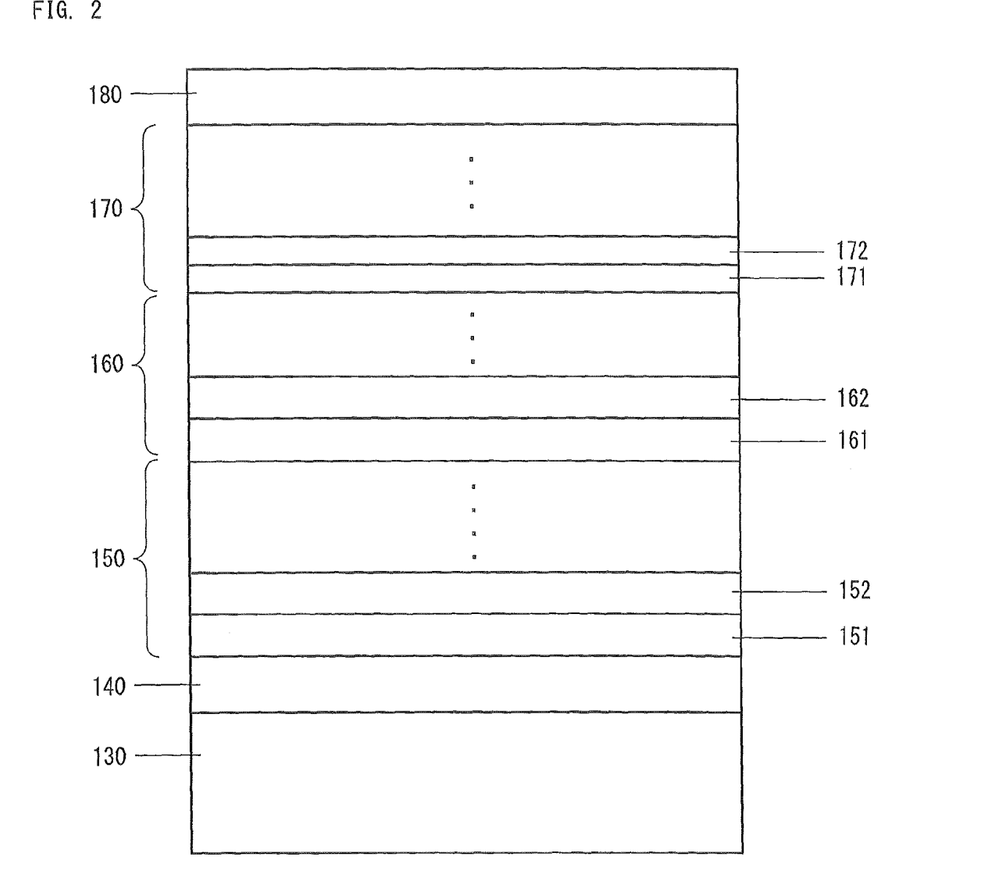
FIG. 2 is a schematic view of the layered structure of the semiconductor layers forming the Group III nitride semiconductor light-emitting device according to embodiment.

FIG. 1 is a schematic view of the structure of a Group III nitride semiconductor light-emitting device 100 according to the present embodiment. FIG. 2 is a schematic view of the layered structure of the semiconductor layers forming the light-emitting device 100. The light-emitting device 100 is a face-up-type semiconductor light-emitting device. The light-emitting device 100 has a plurality of semiconductor layers formed of a Group III nitride semiconductor.

As shown in FIG. 1, the light-emitting device 100 comprises a substrate 110, a low-temperature buffer layer 120, an n-type contact layer 130, an n-type ESD layer 140, an n-type SL layer 150, a light-emitting layer 160, a p-type cladding layer 170, a p-type contact layer 180, an n-electrode N1, a p-electrode P1, and a passivation film F1. The n-type contact layer 130, the n-type ESD layer 140, and the n-type SL layer 150 are n-type semiconductor layers. The p-type cladding layer 170 and the p-type contact layer 180 are p-type semiconductor layers.

On the main surface of the substrate 110, semiconductor layers are formed; i.e., the low-temperature buffer layer 120, the n-type contact layer 130, the n-type ESD layer 140, the n-type SL layer 150, the light-emitting layer 160, the p-type cladding layer 170, and the p-type contact layer 180, in this order. The n-electrode N1 is formed on the n-type contact layer 130. The p-electrode P1 is formed on the p-type contact layer 180.

The substrate 110 serves as a growth substrate having the main surface on which the semiconductor layers are formed through MOCVD. The surface of the substrate may be roughened. The substrate 110 is made of sapphire. The main surface of the sapphire substrate is c-plane, i.e., (0001) plane. Other than sapphire, materials such as SiC, ZnO, Si, and GaN may be used.

The low-temperature buffer layer 120 is provided for forming an upper layer while inheriting the lattice structure of the sapphire substrate 110. Therefore, the low-temperature buffer layer 120 is formed on the main surface of the substrate 110. The low-temperature buffer layer 120 is made of a material such as AlN or GaN.

The n-type contact layer 130 is provided for establishing ohmic contact with the n-electrode N1. A main surface of the n-type contact layer 130 is c-plane. The n-type contact layer 130 is formed on the low-temperature buffer layer 120. The n-type contact layer 130 is located beneath the n-electrode N1. The n-type contact layer 130 is an n-type GaN layer having a Si concentration of $1\times10^{18}/cm^3$ or more. The n-type contact layer 130 may be formed of a plurality of layers having different carrier concentrations, for the purpose of enhancement of ohmic contact with the n-electrode N1. The thickness of the n-type contact layer 130 is, for example, 4 µm. Needless to say, other thickness may be employed.

The n-type ESD layer 140 serves as an electrostatic-breakdown-voltage-improving layer for preventing electrostatic breakdown of each semiconductor layer. The n-type ESD layer 140 is formed on the n-type contact layer 130. The n-type ESD layer 140 is a semiconductor layer in which a non-doped i-GaN layer and an n-type GaN layer are deposited. The thickness of the n-type ESD layer 140 is, for example, 300 nm.

The n-type SL layer 150 serves as a strain-relaxing layer for relaxing the stress applied to the light-emitting layer 160. More specifically, the n-type SL layer 150 is an n-type superlattice layer having a superlattice structure. The n-type SL layer 150 is formed on the n-type ESD layer 140. As shown in FIG. 2, the n-type SL layer 150 is formed by repeatedly depositing layer units, each being formed of an InGaN layer 151 and an n-type GaN layer 152. The thickness of the InGaN layer 151 is 2.5 nm, and that of the n-type GaN layer 152 is 2.2 nm. The number of repetitions is 10 to 20. The total thickness of the n-type SL layer 150 is 70.5 nm. However, the number may fall outside the range. The total thickness may be from 61.5 nm to 79.5 nm. A non-doped GaN layer may be formed between the InGaN layer 151 and the n-type GaN layer 152.

The light-emitting layer 160 emits light through recombination of electrons and holes. The light-emitting layer 160 is formed on the n-type SL layer 150. The light-emitting layer 160 is formed by repeatedly depositing layer units, each unit being formed of a barrier layer 161 and a well layer 162. In other words, the light-emitting layer 160 has a multi-quantum well structure (MQW structure) formed by alternately depositing the above layer units.

The number of repetitions is, for example, 5. Needless to say, the number may fall outside the range. The barrier layer 161 is an AlGaN layer containing In. As described later, the In concentration of the barrier layer 161 is not larger than $6\times10^{19}$ cm$^{-3}$. The well layer 162 is, for example, an InGaN layer. These are merely examples. However, the well layer 162 is a layer containing In. The barrier layer 161 may include a layer other than the above AlGaN layer containing In.

The barrier layer 161 has a thickness of 10 Å to 100 Å. The well layer 162 has a thickness of 10 Å to 50 Å. These values are merely examples. Therefore, the value ranges provided here may be employed. The overall thickness of the light-emitting layer 160 falls within a range of 500 nm to 700 nm. Needless to say, the thickness may fall outside the range.

Moreover, a capping layer may be formed on the well layer 162. The capping layer is, for example, a GaN layer. The capping layer is a protective layer for protecting the well layer 162 from heat, e.g., playing a role to prevent sublimation of In from the well layer 162. The capping layer has a thickness of 2 Å to 18 Å. The thickness of the capping layer is preferably at least 2 Å or more.

The p-type cladding layer 170 is formed on the light-emitting layer 160. As shown in FIG. 2, the p-type cladding layer 170 is formed by repeatedly depositing a p-type InGaN layer 171 and a p-type AlGaN layer 172. The number of repetitions is, for example, 5. The p-type InGaN layer 171 has an In composition ratio of 0.05 to 0.12. The thickness of the p-type InGaN layer 171 is 2 nm. The p-type AlGaN layer 172 has an Al composition ratio of 0.25 to 0.4. The thickness of the p-type AlGaN layer 172 is 2.5 nm. These values are merely examples, and other values may be employed. Also, another layered structure may be employed.

The p-type contact layer 180 is formed on the p-type cladding layer 170. The p-type contact layer 180 is provided for establishing ohmic contact with the p-electrode P1. The p-type contact layer 180 has a thickness of 80 nm. The p-type contact layer 180 is made of p-GaN doped with Mg at an Mg concentration of $1 \times 10^{19}/cm^3$ to $1 \times 10^{22}/cm^3$.

The p-electrode P1 is formed on the p-type contact layer 180. The p-electrode P1 is in ohmic contact with the p-type contact layer 180. The p-electrode P1 is made of ITO.

The n-electrode N1 is formed on the n-type contact layer 130. The n-electrode N1 is in ohmic contact with the n-type contact layer 130. The n-electrode N1 is formed by sequentially forming V film and Al film on the n-type contact layer 130 in this order. It may be formed by sequentially forming Ti film and Al film in this order. Needless to say, the layered structure is not limited to these.

The passivation film F1 covers the side surfaces of the n-type contact layer 130, the n-type ESD layer 140, the n-type SL layer 150, the light-emitting layer 160, the p-type cladding layer 170, and the p-type contact layer 180, and portions of the p-electrode P1 and the n-electrode N1. In other words, the remaining portions of the p-electrode P1 and the n-electrode N1 are not covered with the passivation film F1 and are exposed to the atmosphere. The passivation film F1 is made of, for example, $SiO_2$.

2. Pit Shape
2-1. Overall Pit Shape

Figure 3:
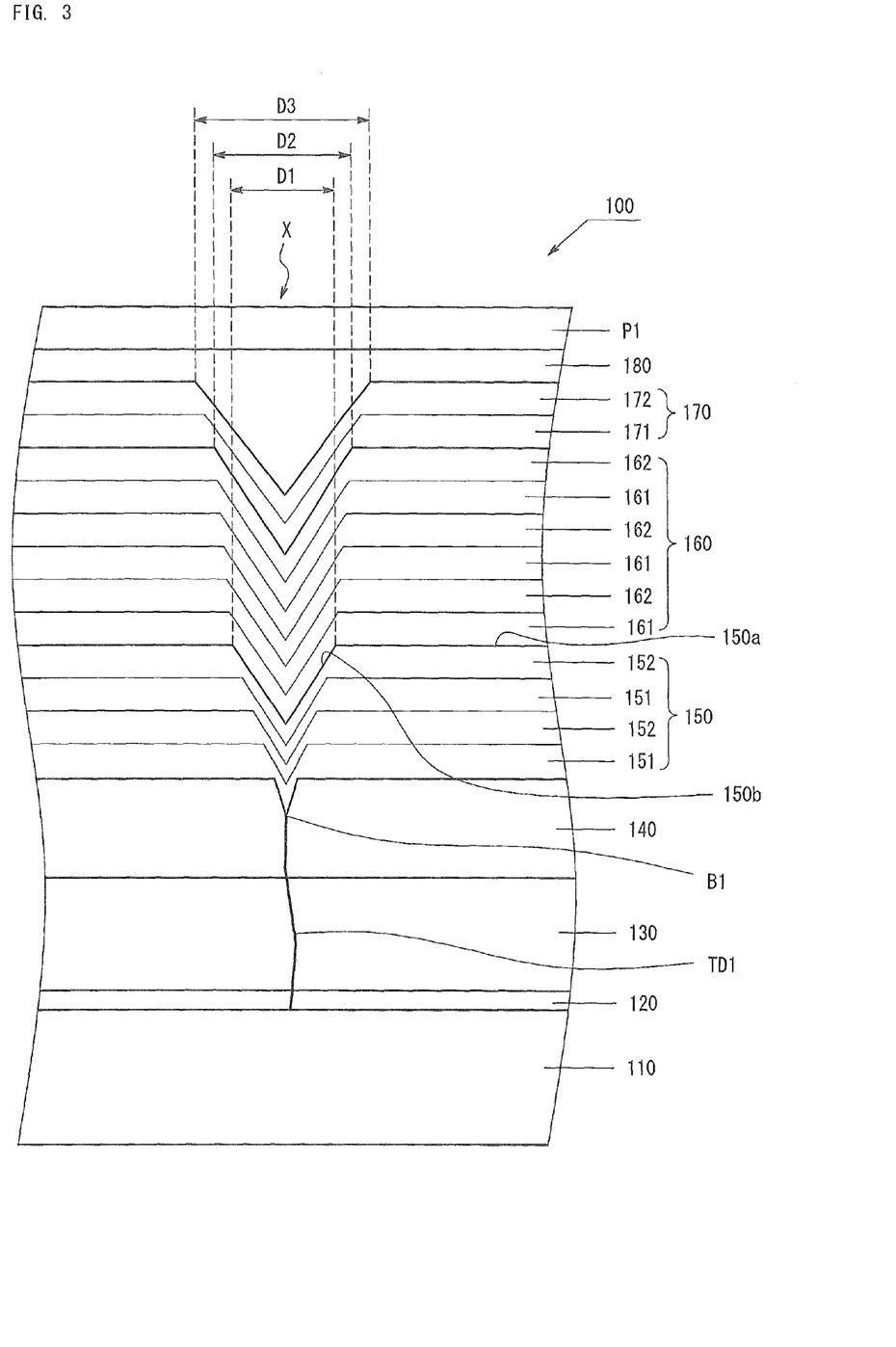
FIG. 3 is a schematic view of a macroscopic shape of a pit generated in the Group III nitride semiconductor light-emitting device according to embodiment.

FIG. 3 shows a pit X provided in the light-emitting device 100. In FIG. 3, the shape of the pits is drawn extremely larger than the actual one. The pit X is generated at a threading dislocation TD1 as a starting point. The pit X grows in the n-type ESD layer 140. In other words, the threading dislocation TD1 growing upward on the substrate 110 laterally extends in the film of the n-type ESD layer 140, i.e., in a direction orthogonal to the growth direction of the threading dislocation, and thus the pit X is formed. The pit X extends from the n-type ESD layer 140 to the p-type cladding layer 170. That is, the pit X is provided so as to extend from the n-type semiconductor layer to the p-type semiconductor layer.

As shown in FIG. 3, in the film thickness of the n-type semiconductor layer, i.e., the n-type ESD layer 140 and the n-type SL layer 150, the diameter of the pit X dominantly increases from the n-type semiconductor layer toward the light-emitting layer 160. In the film thickness of the light-emitting layer 160, the diameter of the pit X slightly increases toward the p-type semiconductor layer. In the film thickness of the p-type semiconductor layer, the diameter of the pit X rather increases toward the p-electrode P1. The expansion rate of the pit X to the thickness of each layer is gradually decreased in the order of the n-type semiconductor layer, the p-type semiconductor layer, and the light-emitting layer.

The cross-sectional shape of the pit X is a hexagon or a circle. Theoretically, it is a hexagon, but the actual cross-sectional shape of the pit X is generally a circle. Thus, hereinafter, for convenience, the opening width of the pit X is referred to as the diameter of the pit X. As is clear from FIG. 3 (D1, D2, and D3), the diameter of the pit X is different depending on the position of the pit in the semiconductor layer.

2-2. Pit in the Light-Emitting Layer

In the present embodiment, both the well layer 162 and the barrier layer 161 of the light-emitting layer 160 contain In. The Group III nitride semiconductor layer containing In tends to grow laterally, i.e., in a direction orthogonal to the film thickness direction. This is because In acts as a catalyst to expand the Group III nitride semiconductor. Thus, the Group III nitride semiconductor containing In tends to enter the inside of the pit X in the growth process.

As shown in FIG. 3, the layer containing In is formed on the underlayer deposited before. The barrier layer 161 being formed directly on the n-type SL layer 150 grows on both a flat surface 150a and a concave 150b of a top surface of the n-type SL layer 150. The barrier layer 161 and the well layer 162 are conical shaped or hexagonal pyramid shaped in a position of the pit X. In this way, the conical shapes or the hexagonal pyramid shapes are deposited.

2-3. Pit in the p-Type Semiconductor Layer

In the film thickness of the p-type semiconductor layer, the pit X is slightly enlarged. The p-type cladding layer 170 includes the p-type InGaN layer 171 and the p-type AlGaN layer 172. The In content of the p-type InGaN layer 171 is not so high. The p-type AlGaN layer 172 not containing In and the p-type InGaN layer 171 are alternately deposited.

2-4. Pit in the n-Type Semiconductor Layer

In the film thickness of the n-type semiconductor layer, the pit X is enlarged. Thought the n-type SL layer 150 includes the InGaN layer 151, the n-type SL layer 150 is not a layer in which the semiconductor layers containing In are continuously formed.

2-5. Pit Diameter

FIG. 3 shows the pit diameters D1, D2, and D3 of the pit X. The pit diameter D1 is the diameter of the pit X at an interface between the light-emitting layer 160 and the n-type SL layer 150. That is, the pit diameter D1 is the diameter of the pit X at an interface between the light-emitting layer 160 and the n-type semiconductor layer. The pit diameter D2 is the diameter of the pit X at an interface between the light-emitting layer 160 and the p-type cladding layer 170. That is, the pit diameter D2 is the diameter of the pit X at an interface between the light-emitting layer 160 and the p-type semiconductor layer. The pit diameter D1 may be defined as the value at the bottom surface of the light-emitting layer 160, and the pit diameter D2 may be defined as the value at the top surface of the light-emitting layer 160. The pit diameter D3 is the diameter of the pit X at an interface between the p-type cladding layer 170 and the p-type contact layer 180. The pit X is provided so as to reach the p-type cladding layer 170, but it does not exist in the p-type contact layer 180 because the pit x is filled with the p-type contact layer 180.

When the horizontal cross-sectional shapes of these pits X are hexagons, the pit diameters D1, D2, and D3 indicate the length of the line segment from one apex of the hexagon to the opposite apex. When the horizontal cross-sectional shapes of these pits X are circles, the pit diameters D1, D2, and D3 indicate the diameters of the circles. Hereinafter, the pit diameters D1, D2, and D3 refer to the mean value for all pits on the respective interfaces.

The pit diameter D1 of the pit X varies in accordance with the film thickness of the n-type ESD layer 140 and with the temperature at which the n-type ESD layer 140 is grown. As the thickness of the n-type ESD layer 140 increases, the pit diameter D1 increases. In contrast, as the thickness of the n-type ESD layer 140 decreases, the pit diameter D1 decreases. Also, as the growth temperature of the n-type ESD layer 140 is elevated, the pit diameter D1 decreases. In contrast, as the growth temperature of the n-type ESD layer 140 is lowered, the pit diameter D1 increases. Thus, the pit diameter D1 can be regulated through setting the thickness and the growth temperature of the n-type ESD layer 140 being formed. Similarly, the pit diameter in the n-type SL layer 150 can also be regulated through setting the thickness and the growth temperature of the n-type SL layer 150 being formed. That is, the relationship between the thickness or the growth temperature of the semiconductor layer being formed and the pit diameter D1 is the same even in the case where the semiconductor layers are formed above the n-type ESD layer.

In the present embodiment, the pit diameter D1 satisfies the following condition (1).

$$120 \text{ nm} \leq D1 \leq 200 \text{ nm} \tag{1}$$

That is, the pit diameter D1 falls within a range of 120 nm to 200 nm. By forming the pit X satisfying the condition (1), the stress applied to the light-emitting layer 160 is relaxed when an AlGaN layer containing In is formed as a barrier layer 161. The details will be described in the below-described experiment section. As described below, the pit diameter D1 of the pit X is preferably 140 nm to 180 nm.

FIG. 3 shows that the pit diameter D2 is slightly larger than the pit diameter D1. That is, the pit diameter D2 at an interface between the light-emitting layer 160 and the p-type semiconductor layer is slightly larger than the pit diameter D1 at an interface between the light-emitting layer 160 and the n-type semiconductor layer. FIG. 3 also shows that the pit diameter D2 is smaller than the pit diameter D3.

The reasons for such variation in pit diameter are the following. The growth rate ratio changes depending on the In concentration of the layer. Here, the growth rate ratio is defined as the ratio of the growth rate in a c-axis direction, which is perpendicular to the main surface, at the outside of the pit to the growth rate in a direction perpendicular to the inclined surface inside the pit. Also, as described below, the growth temperature is different for each layer being deposited, and thus, the above growth rate ratio changes.

3. Method for Producing Semiconductor Light-Emitting Device

The method for producing the light-emitting device 100 according to the present embodiment will be described. The aforementioned respective semiconductor layers are formed through epitaxial crystal growth by metal-organic chemical vapor deposition (MOCVD). The carrier gas employed in the method is hydrogen ($H_2$) or nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$) is employed as a Ga source. Trimethylindium ($In(CH_3)_3$) is employed as an In source. Trimethylaluminum ($Al(CH_3)_3$) is employed as an Al source. Silane ($SiH_4$) is employed as an re-type dopant gas. Cyclopentadienylmagnesium ($Mg(C_5H_5)_2$) is employed as a p-type dopant gas.

3-1. n-Type Contact Layer Formation Step

Firstly, a low-temperature buffer layer 120 is formed on the main surface of a substrate 110. On the buffer layer 120, an n-type contact layer 130 is formed. The substrate temperature is adjusted to 1,080° C. to 1,140° C. The Si doping concentration is $1\times10^{18}/cm^3$ or higher.

3-2. Electrostatic-Breakdown-Voltage-Improving Layer Formation Step

Figure 4:
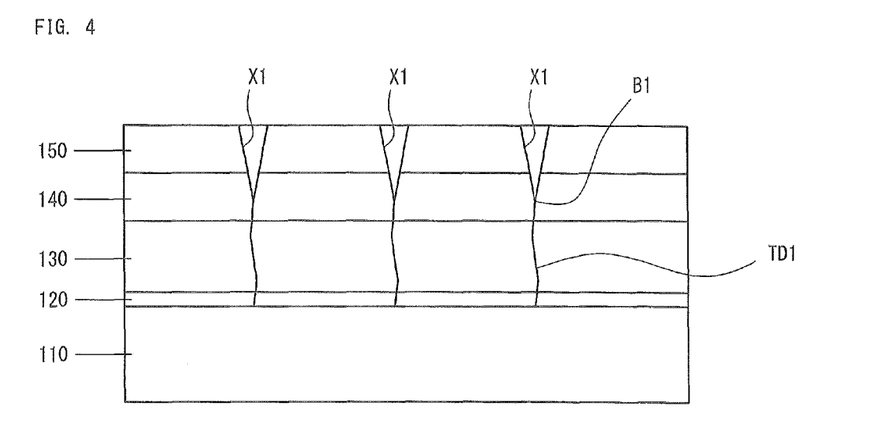
FIG. 4 is a schematic view illustrating the method for producing the Group III nitride semiconductor light-emitting device according to embodiment (part 1)
Figure 5:
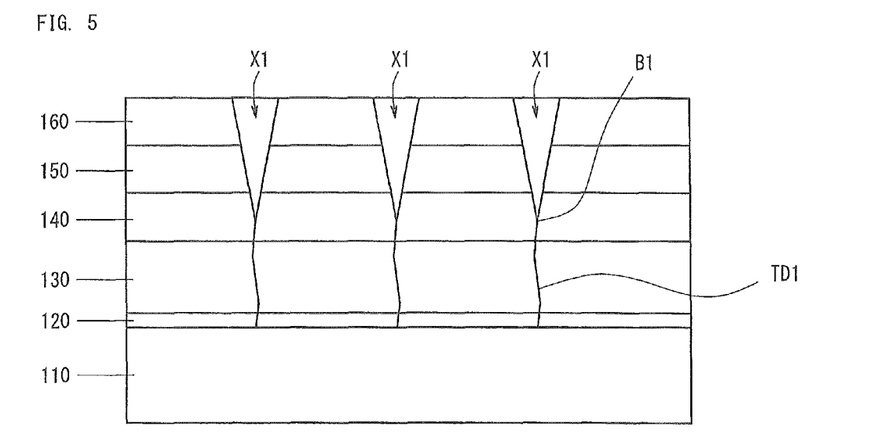
FIG. 5 is a schematic view illustrating the method for producing the Group III nitride semiconductor light-emitting device according to embodiment (part 2)

Then, an n-type ESD layer 140 is formed on the n-type contact layer 130. The substrate temperature is adjusted to 750° C. to 950° C. As shown in FIG. 4, pits X1 are generated from bottoms B1 in this step. The pits X1 grow as the semiconductor layers grow, thereby forming pits X. Thus, the n-type ESD layer 140 is formed while forming the pits X1.

3-3. n-Type Superlattice Layer Formation Step

Next, an n-type SL layer 150 is formed. Firstly, an InGaN layer 151 is formed on the n-type ESD layer 140. Then, as shown in FIG. 2, an n-type GaN layer 152 is formed on the InGaN layer 151. Then, the combination of the InGaN layer 151 and the n-type GaN layer 152 is employed as a layer unit, and the unit is repeatedly formed. Thus, the pits X1 expand as shown in FIG. 4. At this stage, the pit diameter D1 at a top surface of the n-type SL layer 150 satisfies the condition (1).

3-4. Light-Emitting Layer Formation Step

Subsequently, a light-emitting layer 160 is formed. Layer units, each unit comprising a barrier layer 161 and a well layer 162 deposited in this order, are repeatedly deposited. That is, the light-emitting layer formation step includes a barrier layer formation step of forming a barrier layer 161 and a well layer formation step of forming a well layer 162 on the barrier layer 161. These steps are repeatedly carried out.

The substrate temperature at the growth of the barrier layer 161 is adjusted to 800° C. to 980° C. The substrate temperature at the growth of the well layer 162 is adjusted to 730° C. to 850° C. Here, the overall thickness of the light-emitting layer 160 falls within a range of 500 nm to 700 nm.

3-5. p-Type Superlattice Layer Formation Step

Then, a p-type cladding layer 170 is formed by repeatedly depositing a p-type InGaN layer 171 and a p-type AlGaN layer 172.

3-6. p-Type Contact Layer Formation Step

Figure 6:
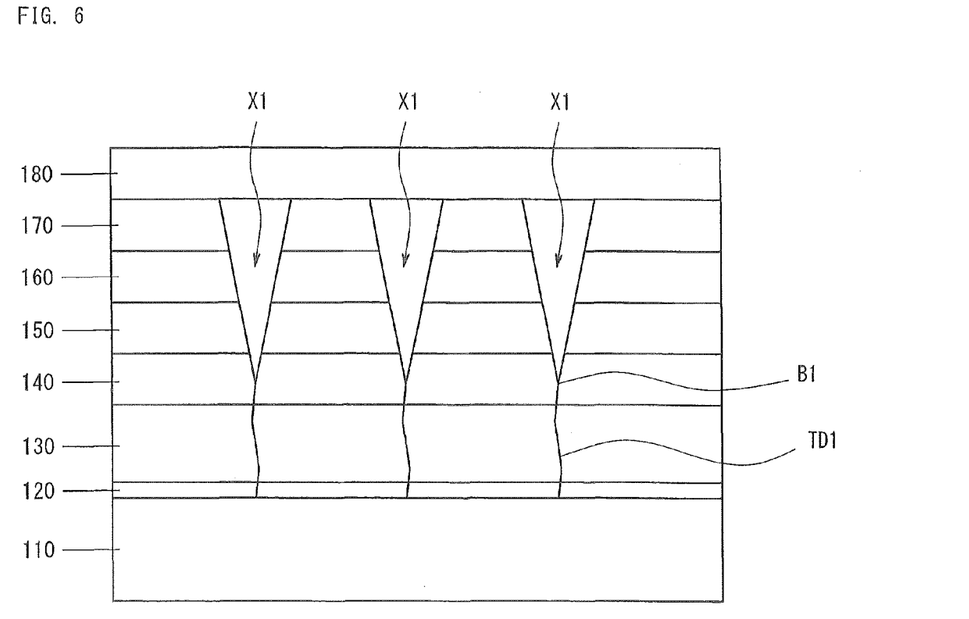
FIG. 6 is a schematic view illustrating the method for producing the Group III nitride semiconductor light-emitting device according to embodiment (part 3)

Then, a p-type contact layer 180 is formed. The substrate temperature is adjusted to 900° C. to 1,050° C. As a result, semiconductor layers are deposited on a substrate 110. At this time, as shown in FIG. 6, the pits X are formed so as to extend from the n-type ESD layer 140 to a bottom surface of the p-type contact layer 180.

3-7. Electrode Formation Step

Then, a p-electrode P1 is formed on the p-type contact layer 180. The semiconductor layers are partially removed by laser lift-off or etching from the p-type contact layer 180, to thereby expose the n-type contact layer 130. An n-electrode N1 is formed on the exposed portion of the n-type contact layer 130. Formation of the p-electrode P1 and formation of the n-electrode N1 may be carried out in any order.

3-8. Insulating Film Formation Step

Then, side surfaces of the semiconductor layers, a portion of the p-electrode P1, a portion of the n-electrode N1 are covered with a passivation film F1. Although an example of the passivation film F1 is a $SiO_2$ film, other transparent insulating films may be employed. In an alternative procedure, the entirety of the light-emitting device 100 is covered with the passivation film F1, and then portions of interest are exposed.

3-9. Other Steps

In addition to the above steps, thermal treatment and other steps may be performed. Through carrying out the steps, the light-emitting device 100 shown in FIG. 1 is produced.

4. Experiment 4-1. In Concentration of Barrier Layer and Light Intensity

Figure 7:
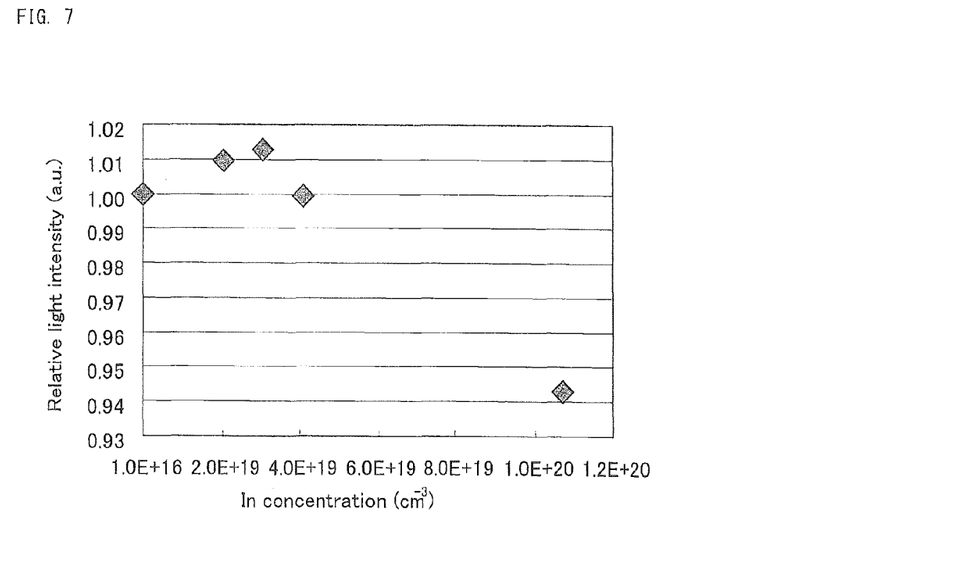
FIG. 7 is a graph showing the relationship between the In concentration of the barrier layer of the light-emitting layer and the light intensity of the light emitting device.

FIG. 7 is a graph showing the relationship between the In concentration of the barrier layer 161 of the light-emitting layer 160 and the relative light intensity of the light-emitting device. As shown in FIG. 7, the light intensity when the In concentration was $1.0\times10^{16}$ cm$^{-3}$ is set as a reference. The relative light intensity at that time was 1. When the In concentration was $2.03\times10^{19}$ cm$^{-3}$, the relative light intensity was 1.010. When the In concentration was $3.06\times10^{19}$ cm$^{-3}$, the relative light intensity was 1.013. When the In concentration was $4.11\times10^{19}$ cm$^{-3}$, the relative light intensity was 0.999. When the In concentration was $1.05\times10^{20}$ cm$^{-3}$, the relative light intensity was 0.943.

As is clear from FIG. 7, when the In concentration of the barrier layer 161 is not larger than $6.0\times10^{19}$ cm$^{-3}$, the relative light intensity of the light-emitting device is high. Moreover, when the In concentration of the barrier layer 161 is $1.0 \times 10^{16}$ cm$^{-3}$ to $4.5 \times 10^{19}$ cm$^{-3}$, the relative light intensity is higher. Therefore, the In concentration of the barrier layer 161 is preferably $1.0 \times 10^{16}$ cm$^{-3}$ to $4.5 \times 10^{19}$ cm$^{-3}$ or $1.0 \times 10^{16}$ cm$^{-3}$ to $3.5 \times 10^{19}$ cm$^{-3}$ or $1.0 \times 10^{16}$ cm$^{-3}$ to $3.0 \times 10^{19}$ cm$^{-3}$, more preferably, $1.0 \times 10^{19}$ cm$^{-3}$ to $3.0 \times 10^{19}$ cm$^{-3}$, most preferably, $2.0 \times 10^{19}$ cm$^{-3}$ to $3.0 \times 10^{19}$ cm$^{-3}$. The pit diameters D1 of the light-emitting device measured in FIG. 7 were all 160 nm to 190 nm.

4-2. Pit Diameter and Light Output

Figure 8:
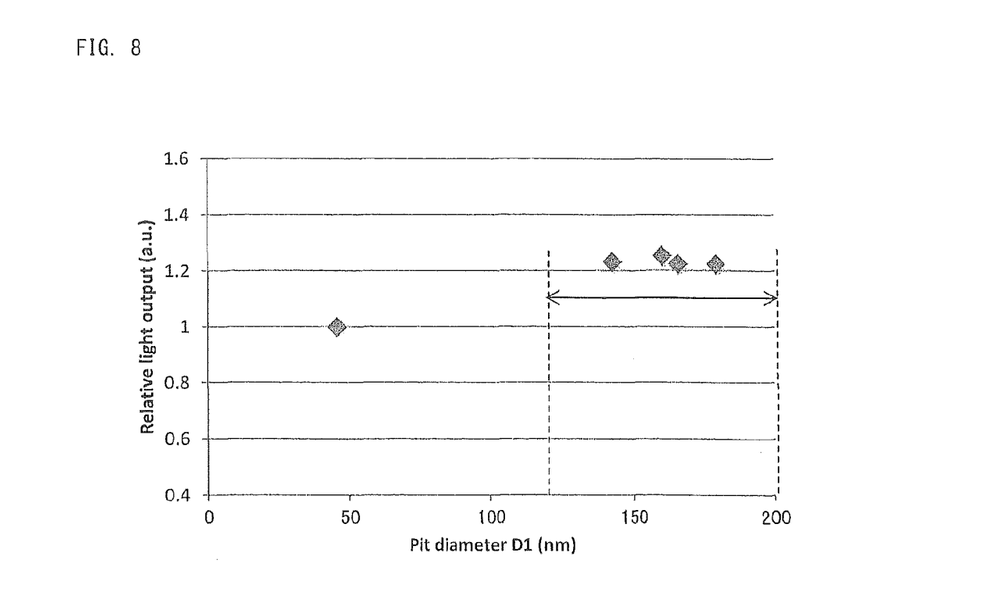
FIG. 8 is a graph showing the relationship between the pit diameter and the relative light output, in which the pit diameter is the value at an interface between the n-type semiconductor layer and the light-emitting layer.

FIG. 8 is a graph showing the relationship between the pit diameter D1 and the relative light output. The horizontal axis of FIG. 8 is pit diameter (nm). The vertical axis of FIG. 8 is relative light output (a.u.). Here, the relative light output when the pit diameter D1 was 45.8 nm is set as 1. As shown in FIG. 8, when the pit diameter D1 satisfies the above-mentioned condition (1), the relative light output is high. The range of the condition (1) is indicated by the bidirectional arrow in FIG. 8. As shown in FIG. 8, the pit diameter D1 of the pit X is preferably 140 nm to 180 nm. The In concentration of the barrier layer 161 of the light-emitting device in FIG. 8 was $2.0 \times 10^{19}$ cm$^{-3}$.

4-3. Pit Diameter Ratio

Figure 9:
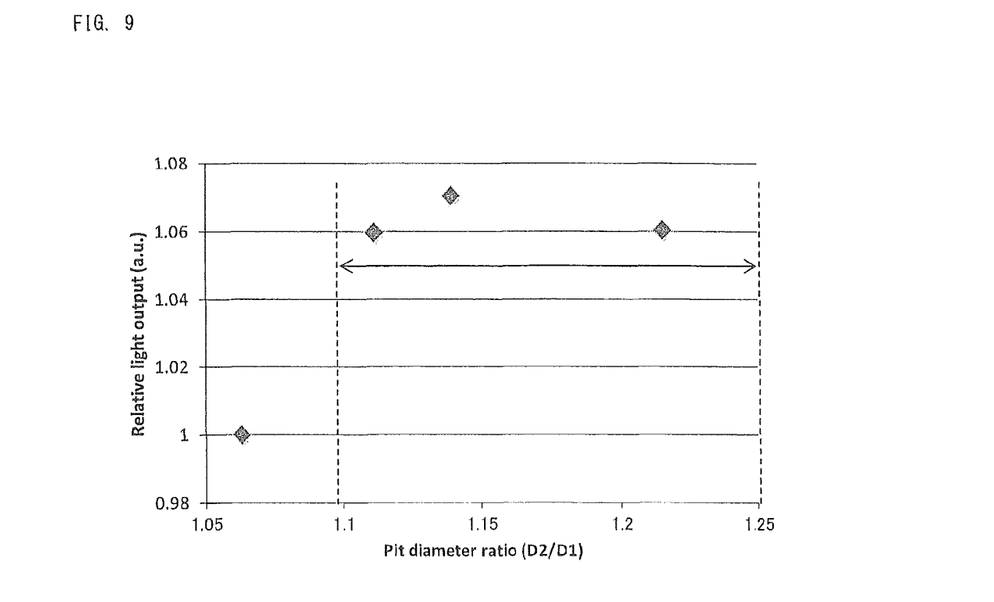
FIG. 9 is a graph showing the relationship between the ratio of pit diameter at an interface between the light-emitting layer and the p-type semiconductor layer to that at an interface between the n-type semiconductor layer and the light-emitting layer and the relative light output.

FIG. 9 is a graph showing the relationship between the ratio R1 of the pit diameter D2 to the pit diameter D1 and the relative light output. As indicated by the bidirectional arrow in FIG. 9, when the ratio R1 of the pit diameter D2 to the pit diameter D1 is 1.1 to 1.25, the relative light output is high.

In FIG. 9, when the In concentration of the barrier layer 161 was $1.07 \times 10^{20}$ cm$^{-3}$, the ratio R1 was 1.06. When the In concentration of the barrier layer 161 was $4.11 \times 10^{19}$ cm$^{-3}$, the ratio R1 was 1.11. When the In concentration of the barrier layer 161 was $2.03 \times 10^{19}$ cm$^{-3}$, the ratio R1 was 1.14. When the In concentration of the barrier layer 161 was $1.0 \times 10^{16}$ cm$^{-3}$, the ratio R1 was 1.22. As described in FIG. 7, when the In concentration of the barrier layer 161 is not larger than $6.0 \times 10^{19}$ cm$^{-3}$, the relative light output is high. As is clear from FIG. 9, the ratio R1 is preferably 1.1 to 1.25, and more preferably, 1.11 to 1.22.

4-4. Comparison with Other Light-Emitting Devices

The light-emitting device 100 according to the present embodiment is compared with the light-emitting device having an AlGaN layer with a high In concentration. If the In concentration of the AlGaN layer in the barrier layer 161 is increased to higher than $6 \times 10^{19}$ cm$^{-3}$, the pit is filled or the pit diameter is smaller than that of the lower layers. That is, the pit diameter decreases toward the upper layer. As a result, the stress applied to the light-emitting layer 160 is not sufficiently relaxed. In such light-emitting device, emission light output is not so high. Moreover, if the AlGaN layer does not contain In in the barrier layer 161, a flat semiconductor layer cannot be obtained.

5. Variations 5-1. p-Electrode

In the present embodiment, the p-type electrode P1 was formed of ITO, which is a transparent conductive oxide. However, other than ITO, transparent conductive oxides such as ICO, IZO, ZnO, TiO$_2$, NbTiO$_2$, and TaTiO$_2$ may also be used. A metal electrode made of a metallic material may be provided on the p-electrode P1. Alternatively, a pad electrode may be provided on the p-electrode P1.

5-2. Types of Light-Emitting Devices

In the present embodiment, a face-up type light-emitting device 100 was described as an example. However, the present invention may be applied to a flip-chip type light-emitting device or a light-emitting device produced through substrate lift-off other than the light-emitting device according to the present embodiment. Even in these cases, pit is generated from the n-type semiconductor layer.

5-3. Pit Length

In the present embodiment, the pit X is formed so as to extend from the n-type semiconductor layer to the p-type semiconductor layer. However, the pit X may be formed so as to extend from the n-type semiconductor layer to at least an interface between the light-emitting layer 160 and the p-type semiconductor layer. That is, the pit X may not be formed in the p-type semiconductor layer, and may be formed so as to reach the top layer of the p-type semiconductor layer.

5-4. Combinations

The above-mentioned variations may be employed in any combination.

6. Summary of Embodiment

As described hereinabove, in the light-emitting device 100 according to the present embodiment, an AlGaN layer containing In is employed as a barrier layer 161 of the light-emitting layer 160, and the pit diameter D1 of the pit X at an interface between the light-emitting layer 160 and the n-type SL layer 150 is adjusted to 120 nm to 200 nm. In this case, the light-emitting device 100 is achieved, in which the stress applied to the light-emitting layer can be relaxed while the surface flatness of the semiconductor layer is maintained.

Since the aforementioned embodiments are merely examples, it should be understood that those skilled in the art can perform various variations and modifications, without deviating the scope of the present invention. The layered structure of the layer unit is not necessarily limited to those illustrated. The layered structure, the number of repetitions of the layers, etc. may be determined. The layer formation method is not limited to metal-organic chemical vapor deposition (MOCVD), and any other methods may be employed, so long as the semiconductor crystal growth is performed by use of a carrier gas.

What is claimed is:

1. A Group III nitride semiconductor light-emitting device including an n-type semiconductor layer, a light-emitting layer, and a p-type semiconductor layer,
   wherein the light-emitting layer comprises a multi-quantum well structure which comprises a well layer comprising InGaN and a barrier layer comprising an AlGaN layer containing In,
   wherein the barrier layer has an In concentration of $1.0 \times 10^{16}$ cm$^{-3}$ to $4.5 \times 10^{19}$ cm$^{-3}$,
   wherein a pit is provided so as to extend from the n-type semiconductor layer to the p-type semiconductor layer,
   wherein the pit diameter D1 is from 120 nm to 200 nm at an interface between the light-emitting layer and the n-type semiconductor layer, and
   wherein a ratio D2/D1 of the pit diameter D2 at an interface between the light-emitting layer and the p-type semiconductor layer to the pit diameter D1 at the interface between the light-emitting layer and the n-type semiconductor layer is 1.1 to 1.25.

2. The Group III nitride semiconductor light-emitting device according to claim 1, wherein the barrier layer has an In concentration of $1.0 \times 10^{16}$ cm$^{-3}$ to $4.1 \times 10^{19}$ cm$^{-3}$.

3. The Group III nitride semiconductor light-emitting device according to claim 2, wherein the ratio D2/D1 of the pit diameter D2 at the interface between the light-emitting layer and the p-type semiconductor layer to the pit diameter D1 at the interface between the light-emitting layer and the n-type semiconductor layer is 1.11 to 1.22.

4. The Group III nitride semiconductor light-emitting device according to claim 3, wherein the pit diameter D1 is from 140 nm to 180 nm at the interface between the light-emitting layer and the n-type semiconductor layer.

5. The Group III nitride semiconductor light-emitting device according to claim 2, wherein the pit diameter D1 is from 140 nm to 180 nm at the interface between the light-emitting layer and the n-type semiconductor layer.

6. The Group III nitride semiconductor light-emitting device according to claim 1, wherein the barrier layer has an In concentration of $2.0 \times 10^{19}$ cm$^{-3}$ to $3.0 \times 10^{19}$ cm$^{-3}$.

7. The Group III nitride semiconductor light-emitting device according to claim 6, wherein the ratio D2/D1 of the pit diameter D2 at the interface between the light-emitting layer and the p-type semiconductor layer to the pit diameter D1 at the interface between the light-emitting layer and the n-type semiconductor layer is 1.11 to 1.22.

8. The Group III nitride semiconductor light-emitting device according to claim 6, wherein the pit diameter D1 is from 140 nm to 180 nm at the interface between the light-emitting layer and the n-type semiconductor layer.

9. The Group III nitride semiconductor light-emitting device according to claim 1, wherein the pit diameter D1 is from 140 nm to 180 nm at the interface between the light-emitting layer and the n-type semiconductor layer.

10. The Group III nitride semiconductor light-emitting device according to claim 9, wherein the ratio D2/D1 of the pit diameter D2 at the interface between the light-emitting layer and the p-type semiconductor layer to the pit diameter D1 at the interface between the light-emitting layer and the n-type semiconductor layer is 1.11 to 1.22.

11. The Group III nitride semiconductor light-emitting device according to claim 10, wherein the barrier layer has an In concentration of $1.0 \times 10^{19}$ cm$^{-3}$ to $3.0 \times 10^{19}$ cm$^{-3}$.

12. The Group III nitride semiconductor light-emitting device according to claim 10, wherein the barrier layer has an In concentration of $2.0 \times 10^{19}$ cm$^{-3}$ to $3.0 \times 10^{19}$ cm$^{-3}$.

13. The Group III nitride semiconductor light-emitting device according to claim 9, wherein the barrier layer has an In concentration of $1.0 \times 10^{19}$ cm$^{-3}$ to $3.0 \times 10^{19}$ cm$^{-3}$.

14. The Group III nitride semiconductor light-emitting device according to claim 1, wherein the ratio D2/D1 of the pit diameter D2 at the interface between the light-emitting layer and the p-type semiconductor layer to the pit diameter D1 at the interface between the light-emitting layer and the n-type semiconductor layer is 1.11 to 1.22.

15. The Group III nitride semiconductor light-emitting device according to claim 14, wherein the barrier layer has an In concentration of $1.0 \times 10^{19}$ cm$^{-3}$ to $3.0 \times 10^{19}$ cm$^{-3}$.

16. The Group III nitride semiconductor light-emitting device according to claim 1, wherein the barrier layer has an In concentration of $1.0 \times 10^{19}$ cm$^{-3}$ to $3.0 \times 10^{19}$ cm$^{-3}$.

* * * * *